(12) United States Patent
Kato (10) Patent No.: US 7,394,195 B2
(45) Date of Patent: *Jul. 1, 2008

(54) ORGANIC EL DISPLAY DEVICE AND SUBSTRATE FOR THE SAME

(75) Inventor: Naoki Kato, Kanagawa (JP)

(73) Assignee: OPTREX Corporation, Tokyo (JP)

( * ) Notice: Subject to any disclaimer, the term of this patent is extended or adjusted under 35 U.S.C. 154(b) by 620 days.

This patent is subject to a terminal disclaimer.

(21) Appl. No.: 10/997,856

(22) Filed: Nov. 29, 2004

(65) Prior Publication Data

US 2005/0162076 A1 Jul. 28, 2005

(30) Foreign Application Priority Data

Dec. 12, 2003 (JP) ............................. 2003-414315

(51) Int. Cl.
*H01J 1/62* (2006.01)
*G09G 3/10* (2006.01)

(52) U.S. Cl. .................. 313/506; 313/498; 313/504; 345/44; 345/48; 315/169.1; 315/169.3

(58) Field of Classification Search ......... 313/498–512; 345/44–48; 315/169.1–169.3
See application file for complete search history.

(56) References Cited

U.S. PATENT DOCUMENTS 7,038,395 B2 * 5/2006 Kato ....................... 315/169.3

* cited by examiner

*Primary Examiner*—Nimeshkumar Patel
*Assistant Examiner*—Anthony T Perry
(74) *Attorney, Agent, or Firm*—Oblon, Spivak, McClelland, Maier & Neustadt, P.C.

(57) ABSTRACT

Scanning electrode circuitous wires are disposed in an area in the vicinity of a left side of a rectangular substrate; data electrode connecting wires, which serve to supply a signal to data electrodes from outside an organic EL display device, are disposed between the data electrodes and an upper side of the rectangular substrate; and scanning electrode connecting wires, which serve to supply a signal to scanning electrodes from outside the organic EL display device, are disposed between the scanning electrodes and a right side of the rectangular substrate.

6 Claims, 6 Drawing Sheets

ORGANIC EL DISPLAY DEVICE AND SUBSTRATE FOR THE SAME

BACKGROUND OF THE INVENTION

1. Field of the Invention

The present invention relates to an organic EL display device, which is capable of being effectively subjected to an aging treatment.

2. Description of the Related Art

Organic EL (Electroluminescence) display devices are current drive display devices, which emit light by themselves when a current is supplied to organic EL layers interposed between an anode and a cathode provided so as to be opposite each other. The organic EL display devices are also called organic LEDs because of having characteristics similar to semiconductor light emitting diodes.

The organic EL devices have such a structure that a plurality of anode strips, which is connected to an anode or forms an anode per se, is provided on a glass substrate in parallel with one another, that a plurality of cathode strips, which is connected to a cathode or forms a cathode per se, is provided in parallel with one another and in a direction orthogonal to the anode strips, and that organic EL layers are interposed between both sets of electrode strips. In organic EL devices wherein the anode strips and the cathode strips are provided in a matrix pattern, each of pixels is formed by the intersection of an anode strip and a cathode strip. In other words, the pixels are provided in a matrix pattern. In general, the cathode strips are made of metal, and the anode strips are made of a transparent conductive layer of, e.g., ITO (indium/tin/oxide).

When the organic EL devices wherein the anode strips and the cathode strips are provided in a matrix pattern are driven by passive matrix addressing, the electrodes in one of the set of anode strips or the set of cathodes strips serves as scanning electrodes, and the electrodes in the other set serve as data electrodes. The scanning electrodes are connected to a scanning electrode driving circuit including a constant-voltage circuit in order to drive scanning electrodes at a constant voltage. The data electrodes are connected to a data electrode driving circuit having a constant-current circuit provided at an output stage. In synchronization with scanning, the respective data electrodes are supplied with a current, which is produced in response to a display data for the row corresponding to a selected scanning electrode.

When organic EL display devices having an organic EL device are driven at a constant current, luminance is gradually reducing with the lapse of time. The higher the initial luminance is, the more greatly the degree of luminance decreases. For example, when the initial luminance is twice, the half luminance lifetime is reduced to about half. Additionally, there is caused a phenomenon that luminance varies from pixel to pixel. This is because the longer light emitting time a pixel has, the darker the pixel becomes. This phenomenon is called "image sticking". When adjacent pixels have a luminance difference of from about 3 to about 5%, the luminance difference can be visually recognized.

When organic EL display devices are energized, the luminance of the organic EL display devices greatly reduces at the initial stage and then is gradually reducing in most cases. In a case wherein the luminance is reducing in that way, when organic EL display devices, which have been driven for some period of time and have had luminance reduced, are newly set at an initial state, the luminance is moderately reducing after the initial state. The treatment wherein organic EL display devices are driven for some period of time to reduce the luminance before the organic EL display devices are practically used (before practical use) is called an aging treatment (hereinbelow, referred to as a lifetime aging treatment).

As the lifetime aging treatment, there is a method wherein the anode strips of an organic EL display device are short-circuited through a lead wire and connected to a voltage applying device, and wherein the cathode strips of the organic EL display device are short-circuited through a lead wire and connected to the voltage applying device (see JP-A-6-20774, paragraphs 0003 and 0006, and FIG. 8). A voltage pulse is applied between the lead wire for connection of the anode strips and the lead wire for connection of the cathode strips from the voltage applying device for a certain period of time.

During fabrication of organic EL display devices, a foreign substance, such as dirt, is mixed into an organic EL layer disposed between an anode strip and a cathode strip, or a projection that is formed on an anode strip intrudes into an organic EL layer in some cases. When electric charges concentrate at such a foreign substance or projection to locally produce heat during practical use of such defective organic EL display devices, decomposition of an organic substance in the organic EL layer progresses. Finally, the organic substance is broken along with a cathode strip, and short-circuit between the cathode strip and an anode strip (interlayer short-circuit) occurs. When the short-circuit occurs, there is caused a phenomenon that a specific pixel fails to emit light during practical use.

In order to avoid the occurrence of such a phenomenon during practical use, an aging treatment is performed wherein a defective portion with a foreign substance mixed therein is preliminarily put in an insulated state as an electrically open state or in a non-conducting state by oxidation as disclosed in, e.g., JP-A-2003-282253, paragraphs 0004 to 0007 (hereinbelow, referred as to a short-circuit aging treatment). The short-circuit aging treatment is performed by applying a d.c. voltage pulse between the anode strips and the cathode strips.

BRIEF SUMMARY OF THE INVENTION

Figure 4:
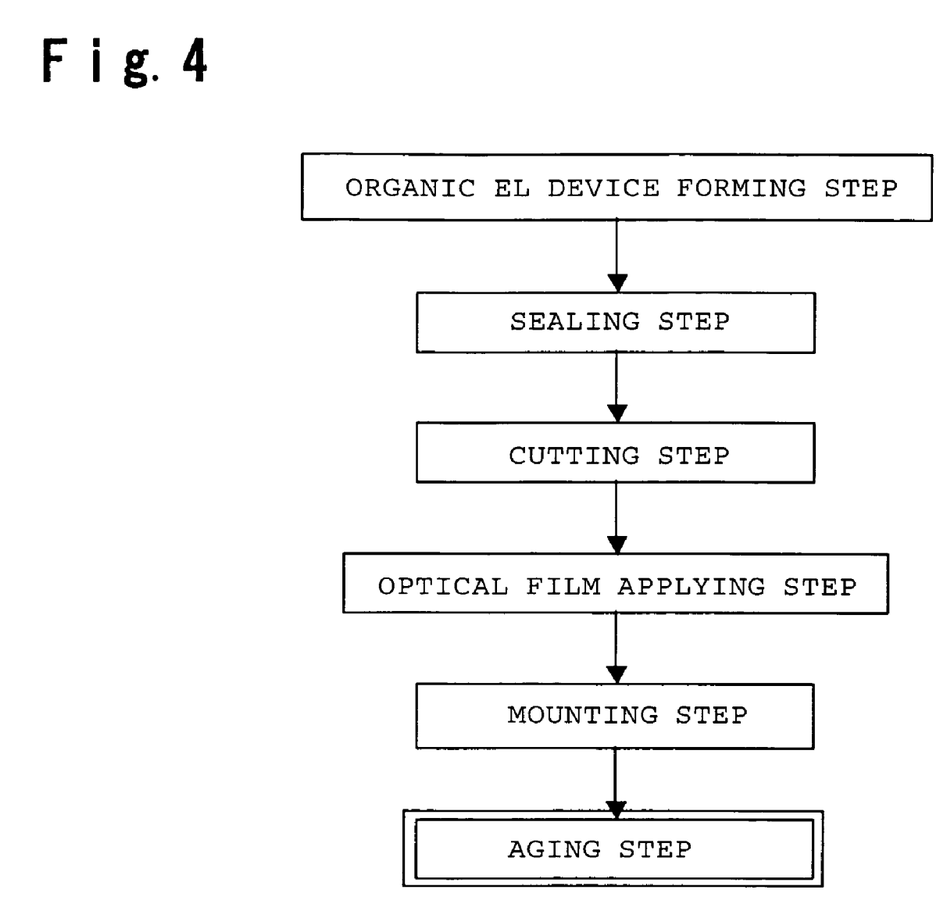
FIG. 4 is a process chart explaining a method for fabricating conventional organic EL display devices.

When an organic EL display device using an organic EL device is fabricated, it is common to form a plurality of organic EL devices on a single large glass substrate. As shown in the process flow chart of FIG. 4, a usual fabrication process performs an organic EL device forming step for forming electrode strips and organic EL layers on a single glass substrate, a sealing step for using an opposite substrate made of, e.g., glass to isolate the organic EL layers from ambient air for protection against, e.g., moisture in each of the organic EL devices, a cutting step for cutting the glass substrate to separate the organic EL devices from one anther, an optical film applying step for applying an optical film, such as a circular polarizer, to each of the organic EL devices for prevention of reflection, and a mounting step for mounting peripheral circuits, such as driving circuits, to the organic EL devices in order complete organic EL display devices in this order.

In order to effectively perform the short-circuit aging treatment or the lifetime aging treatment, it is preferred to perform these aging treatments before the cutting step. In order to perform these aging treatment before the cutting step, there is a proposal wherein wires, which are used for application of a voltage for the aging treatments, and which are connectable to a voltage applying device provided outside organic EL display devices, are disposed on a glass substrate with a large number of organic EL devices formed thereon, and wherein the voltage is collectively applied between the anode strips and between the cathode strips of the organic EL devices. The connected state of the anode strips and the connected state of the cathode strips by such wires are eliminated by cutting the wires in the cutting step. By this proposal, it is possible to effectively subject such a large number of organic EL devices to the aging treatments for a short period of time.

However, some of organic EL display devices are fabricated by COG (chip on glass) mounting, wherein organic EL devices and driving circuits are mounded on a single substrate. In some cases, it is difficult to apply the proposal to organic EL display devices to be fabricated by COG mounting.

Figure 6:
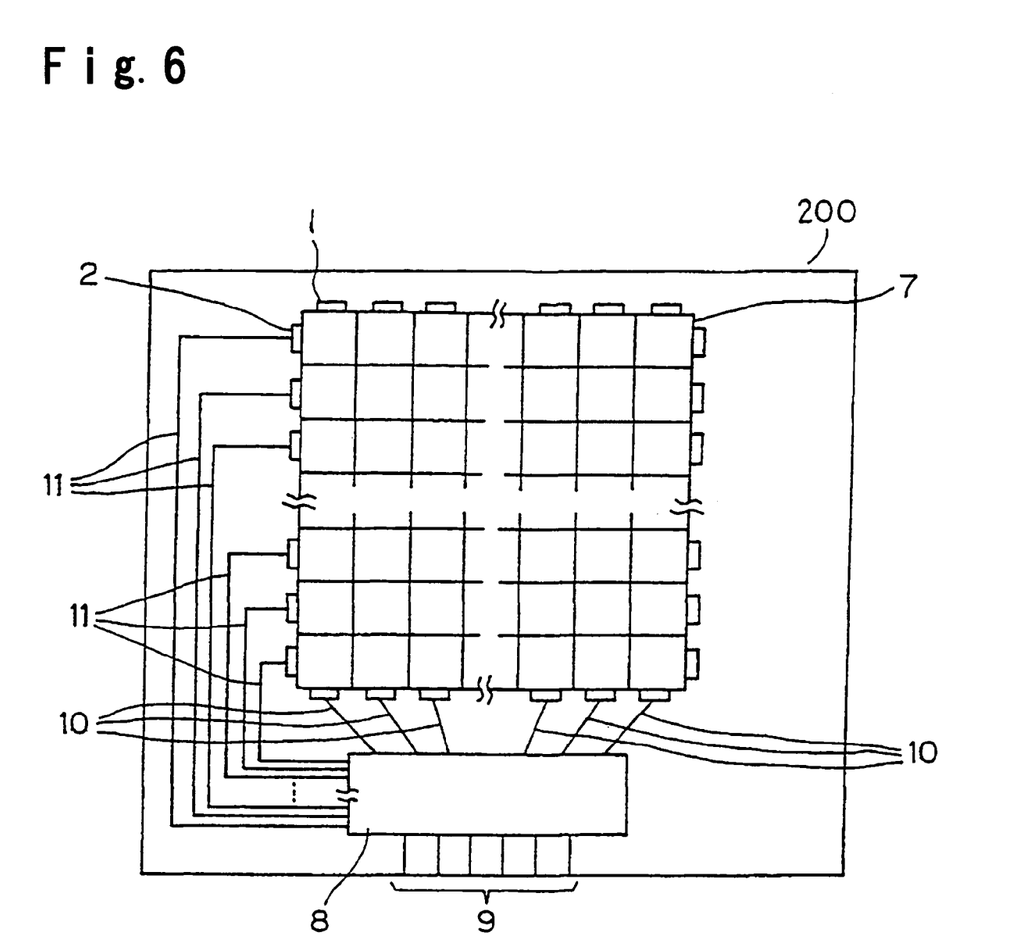
FIG. 6 is a schematic plan view showing a conventional organic EL display device to be formed by COG mounting.

FIG. 6 is a schematic plan view showing a conventional organic EL display device 200, which is fabricated by COG mounting. In the organic EL display device, a driver IC 8 as a driving circuit has connection pads (not shown) for outputting signals for driving scanning electrodes. The connection pads are formed in the vicinity of a left lateral side of a rear surface of the driver IC. The driver IC 8 has additional connection pads (not shown) for outputting signals for driving data electrodes. The additional connection pads are formed in the vicinity of an upper side of the rear surface of the driver IC. In other words, the driver IC 8 is a surface-mounted IC.

Explanation will be made of a case wherein anode strips serve as the data electrodes, and cathode strips serve as the scanning electrodes. It is difficult to apply the proposed method to a case wherein as shown in FIG. 6, wires (hereinbelow, referred to as data electrode circuitous wires) 10 extend from the upper side of the driver IC 8 to an organic EL device 7, and wires (hereinbelow, referred to as scanning electrode circuitous wires) 11 extend from a side orthogonal to the upper side of the driver IC 8 to the organic EL device 7. This is because it is difficult to ensure that respective routes (wires), which are used to electrically connect all scanning electrode circuitous wires 11 outside of the organic EL display device 200, are provided on a glass substrate.

For this reason, it is necessary to perform the aging treatments after the cutting step in connection with organic EL display devices to be fabricated by COG mounting. In order to perform the aging treatments in this way, the number of organic EL display devices to be driven for the aging treatments increases. In particular, when organic EL display devices having small dimensions, such as 2 by 2 inches, are fabricated; tens of organic EL display devices are divided from a single glass substrate. Such a large number of organic EL display devices need to be subjected to the aging treatments. Additionally, a large number of lead wires need to be provided for connection with the power supply. Accordingly, the aging treatments require much work.

In the organic EL display devices to be fabricated by COG mounting, a voltage for the aging treatments is supplied through the driver ICs mounted on the glass substrate. However, the driver ICs have a limit in terms of available output voltages. From this viewpoint, in particular, when the short-circuit aging treatment is performed, there is a possibility that a required phenomenon, such as non-conduction of a defective part, fails to be exhibited in a sufficient may.

It is an object of the present invention to solve the problems stated earlier and to provide an organic EL display device capable of being effectively subjected to an aging treatment for a short period of time to reduce the work required for the aging treatment even when the organic EL display device is fabricated by COG mounting, and to provided a substrate for the organic EL display device.

According to a first aspect of the present invention, there is provided an organic EL display device, comprising a rectangular substrate having a first side, a second side orthogonal to the first side, a third side opposite the first side and the fourth side opposite the second side; an organic EL device mounted on the substrate, the organic EL device including a plurality of data electrodes, a plurality of scanning electrodes and a light emitting layer; a driving circuit mounted on the substrate and in the vicinity of the first side of the substrate, the driving circuit driving the organic EL device and comprising an integrated circuit; the respective data electrodes being connected to the driving circuit through data electrode circuitous wires; the respective scanning electrodes being connected to the driving circuit through scanning electrode circuitous wires; the data electrode circuitous wires being disposed in an area between the organic EL device and the driving circuit on the substrate; the scanning electrode circuitous wires being disposed in an area in the vicinity of the second side of the substrate; first wires for aging connection being disposed between the data electrodes and the third side of the substrate, the first aging connection wires serving to supply a signal to the data electrodes from outside the organic EL display device; and second wires for aging connection being disposed between the scanning electrodes and the fourth side of the substrate, the second wires for aging connection serving to supply a signal to the scanning electrodes from outside the organic EL display device.

According to a second aspect of the present invention, there is provided an organic EL display device, comprising a rectangular substrate having a first side, a second side orthogonal to the first side, a third side opposite the first side and the fourth side opposite the second side; an organic EL device mounted on the substrate, the organic EL device including a plurality of data electrodes, a plurality of scanning electrodes and a light emitting layer; a driving circuit mounted on the substrate and in the vicinity of the first side of the substrate, the driving circuit driving the organic EL device and comprising an integrated circuit; the respective data electrodes being connected to the driving circuit through data electrode circuitous wires; the respective scanning electrodes being connected to the driving circuit through scanning electrode circuitous wires; the data electrode circuitous wires being disposed in an area in the vicinity of the second side of the substrate; the scanning electrode circuitous wires being disposed in an area between the organic EL device and the driving circuit; first wires for aging connection being disposed between the data electrodes and the fourth side of the substrate, the first aging connection wires serving to supply a signal to the data electrodes from outside the organic EL display device; and second wires for aging connection being disposed between the scanning electrodes and the third side of the substrate, the second aging connection wires serving to supply a signal to the scanning electrodes from outside the organic EL display device.

According to a third aspect of the present invention, the organic EL display device wherein the first wires for aging connection or the second wires for aging connection are made of transparent conductive films, and the transparent conductive films have an aspect ratio as wire-length/wire-width of not lower than 20 in the first or the second aspect.

According to a fourth aspect of the present invention, there is provided a substrate for organic EL display devices, wherein a plurality of organic EL display devices, each of which is defined in any one of the first, the second or the third aspect, are formed in a single large substrate; first wires for aging connection on all rectangular substrates are electrically connected to one another; and second wires for aging connection on all rectangular substrates are electrically connected to one another.

The present invention is appropriately applicable to a large number of organic EL display devices, which are formed on a single glass substrate by COG mounting.

In accordance with the present invention, it is possible to effectively subject an organic EL display device to the short-circuit aging treatment and the lifetime aging treatment for a short period of time to reduce the work required for the aging treatments when the organic EL display device is fabricated by COG mounting.

DETAILED DESCRIPTION OF THE INVENTION

Figure 1:
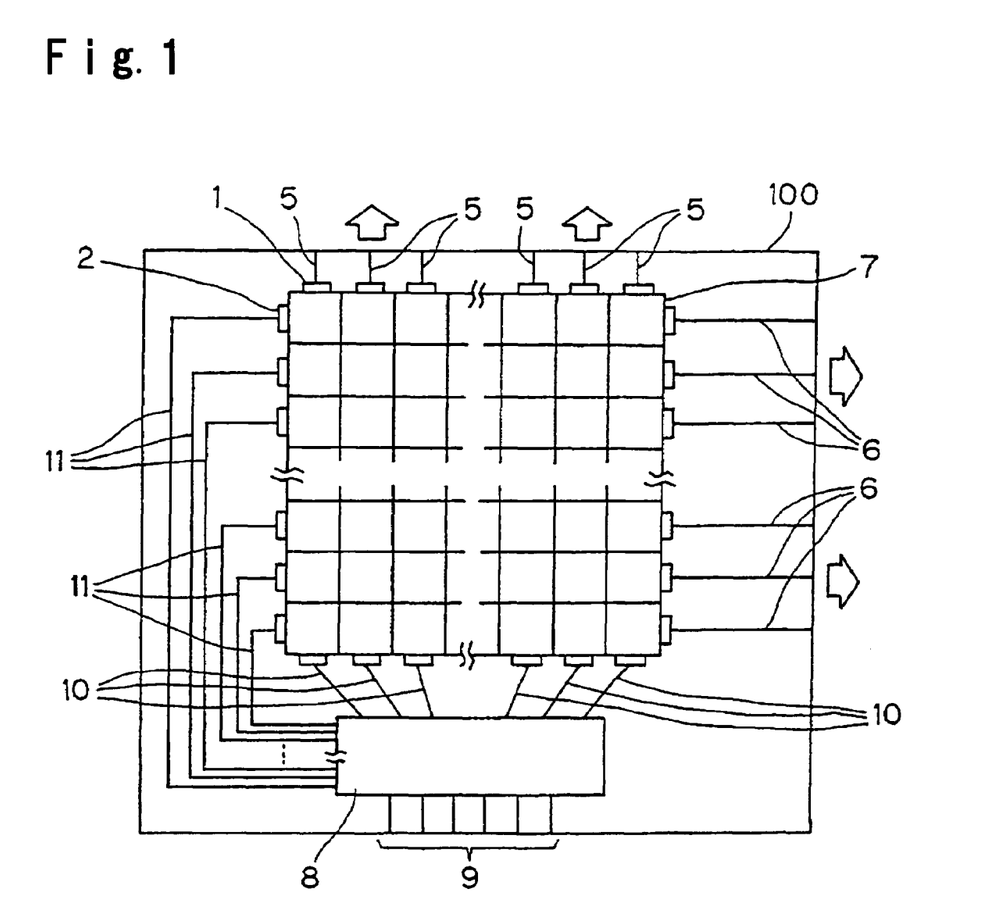
FIG. 1 is a plan view of the organic EL display device according to an embodiment of the present invention.
Figure 2:
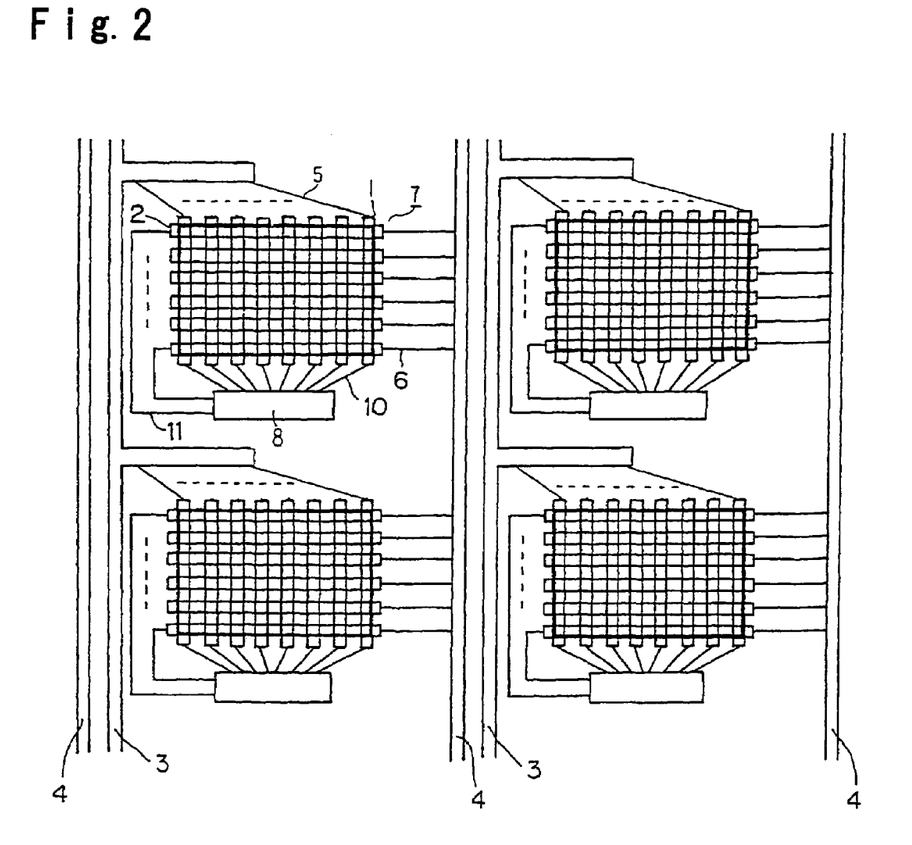
FIG. 2 is a plan view of a plurality of organic EL display devices, which is provided on a single glass substrate.

Now, embodiments of the present invention will be described, referring to the accompanying drawings. FIG. 1 is a plan view of the organic EL display device 100 according to an embodiment of the present invention. FIG. 2 is a plan view of a plurality of organic EL display devices, which is provided on a single glass substrate (large substrate). Although anode strips and cathode strips serve as data electrodes and scanning electrodes, respectively, in this embodiment, the cathode strips and the anode strips may serve as data electrodes and scanning electrodes, respectively.

As shown in FIG. 1, each of the organic EL display devices 100 includes a rectangular substrate, which has an organic EL device (screen) 7 and a driver IC 8 as a single chip LSI mounted thereon. Each of the organic EL display devices 100 in this embodiment is fabricated by COG (chip on glass) mounting, wherein each of the organic EL device 7 and the driving circuit are mounted on the rectangular substrate.

The driver IC 8 has a scanning electrode driving circuit for driving scanning electrodes 2 and a data electrode driving circuit for driving data electrodes 1 incorporated therein. The driver IC 8 has data output terminals connected to the respective data electrodes (the respective anode strips in this embodiment) 1 through data electrode circuitous wire (anode strip circuitous wires in this embodiment) 10. The driver IC 8 has scanning output terminals connected to the respective scanning electrodes (the respective cathode strips in this embodiment) 2 through scanning electrode circuitous wires (cathode strips circuitous wires in this embodiment) 11.

The driver IC 8 is supplied with signals corresponding to a display data or power from outside the organic EL display device 100 through input signal lines 9, which are provided in the vicinity of a lower side (a side that is located at the lowest position of the four sides shown in FIG. 1) of the organic EL display device 100. The driver IC 8 has connection pads (not shown) formed in the vicinity of a left side on a rear surface thereof for connection with the scanning electrode circuitous wires 11. The driver IC 8 has additional connection pads (not shown) formed in the vicinity of an upper side on the rear surface thereof (a side shown in at an upper position among the four sides in FIG. 1) for connection with the data electrode circuitous wires 10. In other words, the driver IC 8 is a surface-mounted IC.

When an organic EL display device is fabricated, a plurality of organic EL display devices is provided on a single glass substrate as shown in FIG. 2. A wire pattern for first common wires 3, which serve as common wires for aging the data electrodes, and a wire pattern for second common wires 4, which serve as common wires for aging the scanning electrodes, are formed on the glass substrate.

The respective data electrodes 1 of each of the organic EL display devices 100 are connected to the first common wires 3 through an upper side (the side opposite the side having ends of the input signal lines 9 among the four sides) of the relevant organic EL display device 100 by data electrode connecting wires 5 as wires for aging connection. All first common wires 3 are electrically connected to one another at a portion on the glass substrate outside the range shown in FIG. 2. Additionally, the respective scanning electrodes 2 of each of the organic EL devices are connected to the second common wires 4 through a right side of the relevant organic EL display device 100 (a side in an area remote from an area with the scanning electrode circuitous wires 11 formed to the relevant organic EL device 7 on the glass substrate) by scanning electrode connecting wires 6 as wires for aging connection. All second common wires 4 are electrically connected to one another at a portion on the glass substrate outside the range shown in FIG. 2.

By this arrangement, on the single large glass substrate, the data electrode connecting wires 5 as the first wires for aging on each of the rectangular substrates are electrically connected to one another through the relevant first common wire 3, and the scanning electrode connecting wires 6 as the second wires for aging on each of the rectangular substrates are electrically connected to each other through the relevant second connection wire 4. Thus, the respective scanning electrodes 2 of all organic EL display devices 100 can be supplied with a common signal from the second common wires 4 before a cutting step. The respective data electrodes 1 of all organic EL display devices 100 can be also supplied with a common signal from the first common wires 3 before the cutting step. Thus, it is possible to collectively subject such a large number of organic EL display devices 100 to an aging treatment.

The connection between the first common wires 3 and the data electrode connecting wires 5 is cut in the cutting step. The connection between the second common wires 4 and the scanning electrode connecting wires 6 is also cut in the cutting step.

Figure 3:
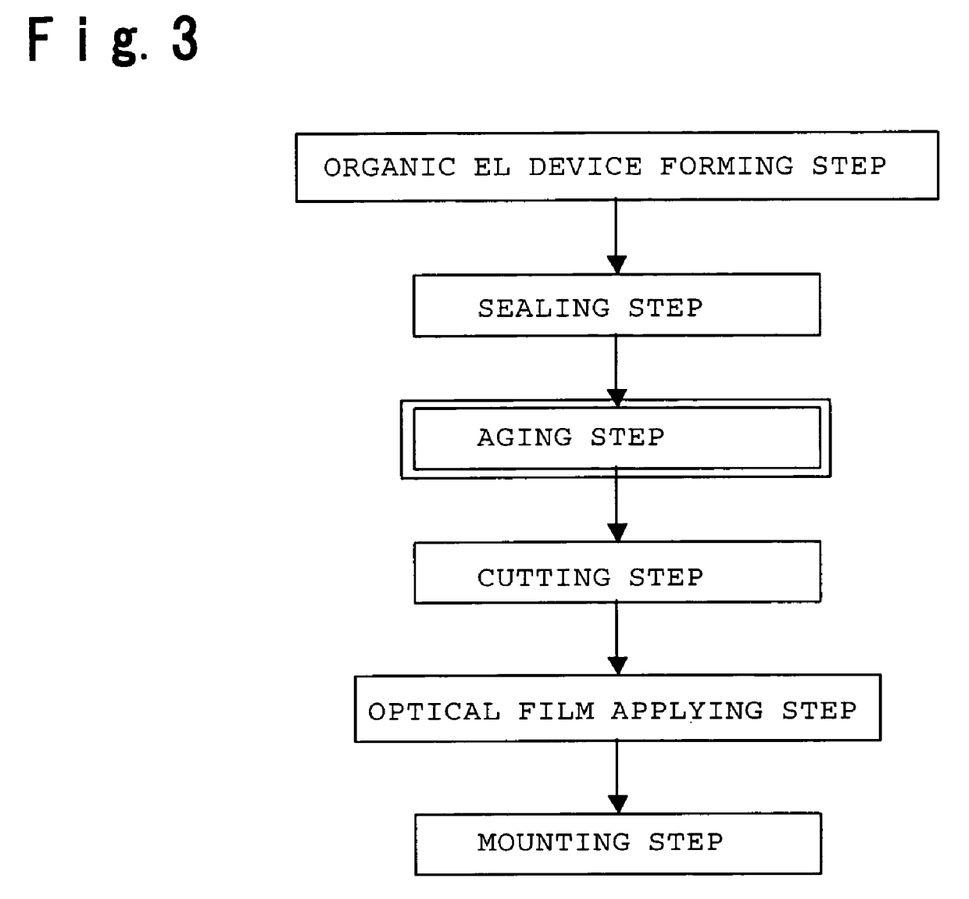
FIG. 3 is a process chart explaining a method for fabricating organic EL display devices according to the present invention.

FIG. 3 is a process chart for explaining an example of the method for fabricating organic EL display devices 100 according to the present invention. In the process shown in FIG. 3, the respective organic EL display devices 100 are fabricated by performing an organic EL device forming step for forming electrodes strips and a plurality of organic EL layers on a single glass substrate, a sealing step for using an opposite substrate made of, e.g., glass to isolate the organic EL layers from ambient air for protection against moisture in each of the organic EL display devices, an aging step for performing an aging treatment to subject the organic EL display devices 100 to aging, a cutting step for cutting the glass substrate to separate the organic EL display devices 100 from one another, an optical film applying step for applying an optical film, such as a circular polarizer, to each of the organic EL display devices for prevention of reflection, and a mounting step for mounting driver ICs 8 to the organic EL display devices.

In the organic EL device forming step, an ITO film is deposited on the glass substrate, and the ITO film is etched to form the data electrodes 1, the data electrode connecting wires 5 and the scanning electrode connecting wires 6. Next, a metal film is deposited, and the metal film is etched to form the data electrode circuitous wires 10, the scanning electrode circuitous wires 11, the first common wires 3, and the second common wires 5. Then, by performing exposure, development or the like, aperture areas, which serve as light emitting portions in respective pixels, are formed in the organic EL devices 7. On the structure thus formed, thin organic films are laminated as organic EL layers. A first hole transport layer, a second hole transport layer, a light emitting layer and a cathode interface layer are formed as the thin organic films in this order. Finally, the cathode strips are made from a metal, such as aluminum, so as to serve as the scanning electrodes 2, and the cathode strips are connected to the scanning electrode circuitous wires 11.

When the organic EL device forming step has been completed, an organic EL display device substrate is provided so as to have such a structure that the respective data electrodes 1 in each of a plurality of the passive matrix organic EL devices formed on the glass substrate are electrically connected to the relevant common wire 3 through the relevant data electrode connecting wires 5 on the glass substrate, and that the respective scanning electrodes 2 in each of the organic EL devices are electrically connected to the relevant second common wire 4 through the relevant scanning electrode connecting wires 6 on the glass substrate.

In the sealing step, in order that the organic EL layers, which have been formed on the glass substrate in the organic EL device forming step, are protected against moisture, another glass substrate as a second substrate is provided so as to confront to the first glass substrate, and both glass substrates are bonded together by a peripheral seal as a gap material in each of the organic EL devices. Then, a dry nitrogen gas is sealed in a sealed space, which is defined by the two glass substrates and the peripheral seal.

Next, the short-circuit aging treatment and the lifetime aging treatment are performed in the aging step. In order to energize the data electrodes 1 and the scanning electrodes 2 for aging, the first common wires 3 and the second common wires 4 are connected to a voltage application device for aging. In the short-circuit aging treatment, the energizing voltage is applied so that a reverse bias (wherein the voltage at the scanning electrodes is higher than that at the data electrodes) is greater than that on actual driving. In the life aging treatment, in order to reduce luminance to a desired level for a shorter period of time, the energizing conditions are set so that the luminance of each pixel in the aging treatment is higher than the luminance, which is obtained when the respective organic EL display devices operate at a rated display action. For example, when the organic EL display devices have a required luminance of 200 $cd/m^2$, the organic EL display devices are energized so as to emit light at 400 $cd/m^2$. By energizing the organic EL display devices to emit light at a luminance, which is two times higher than the required luminance, it is possible to complete the aging step for a half period of time in comparison with the period of time required when the organic EL display devices are subjected to aging at the same luminance as the required luminance.

In the cutting step, the glass substrate is cut to separate the organic EL display devices 100 from one another. In other words, the respective data electrodes 1 and the respective scanning electrodes 2 are separated from the first common wires 3 and the second common wires 4. Cutting positions may extend into the data electrodes 1 or the scanning electrodes 2. Next, optical films for prevention of reflection, such as circular polarizers, are applied to the respective organic EL devices in the optical film applying step. Then, in the mounting step, the respective EL display devices 100 are completed by mounting the driver ICs 8 to the respective EL devices and connecting flexible cables to the input signal lines 9 for transmitting external signals to the input signal lines.

When a large number of organic EL devices are formed on a single glass substrate, edges of the glass substrate are usually cut out and discarded in the cutting step. From this viewpoint, when the first common wires 3 and the second common wires 4, which are formed outside the respective organic EL display devices 100, are formed at portions to be cut out, the glass substrate has no waste portions even if the first common wires 3 and the second common wires 4 are formed.

The glass substrate may be cut so that each of the organic EL display devices 100 has a portion of the relevant first common wire 3 and a portion of the relevant second common wire 4 remaining therein after performing the cutting step. In this case, when the remaining portions of the first common wires 3 and the second common wires 4 are located in areas where the peripheral seals are formed in the sealing step, the glass substrate has no waste portion even if the first common wires 3 and the second common wires 4 are formed.

The areas of dummy regions, which are cut out when cutting the single large glass substrate (mother substrate) to separate the organic EL devices 7 from one another, is preferably as small as possible. From the viewpoint of production efficiency, the ratio of the area of the dummy regions to the area of the mother substrate is set at not higher than 20%, preferably at not higher than 10%.

As explained, according to this embodiment, it is possible to collectively energize the plural organic EL devices in the aging step. Accordingly, it is possible to reduce the work required for performing the aging treatments. Additionally, it is possible to perform the aging treatments in a high-temperature environment since the aging step is performed before the optical film applying step.

As the first common wires 3 and the second common wires 4, metal wires having a low resistance are used. As the data electrode connecting wires 5 and the scanning electrode connecting wires 6, wires, which are made of a transparent conductive film having a higher resistance than the metal wires, are used. By using these materials, all organic EL display devices are supplied with a substantially uniform voltage through the first common wires 3 and the second common wires 4. Even if one of the organic EL devices is short-circuited between an anode strip and a cathode strip, a current is prevented from concentrating at the short-circuited organic EL device to burn the short-circuited organic EL device by overheat since the respective data electrode connecting wires 5 and the respective scanning electrode connecting wires 6 are connected to the connecting wires having a high resistance. Additionally, it is possible to prevent the voltage applied to the other organic EL devices from decreasing since a voltage drop in the first common wires 3 and the second common wires 4 are large.

The metal that is used as the first common wires 3 and the second common wires 4 preferably has a surface resistance of not higher than 0.2 $\Omega$/sq and a wire width of not narrower than 200 µm for the purpose of obtaining low resistance. In consideration of the occupied areas of these common wires on the glass substrate (the occupied areas of cut-out portions and the occupied areas in the portions with the peripheral seals formed thereon), the wire width is preferably not wider than 3 mm. As the wire material, it is preferable to use aluminum, a laminated structure of aluminum and another metal, or a silver-based alloy. As the data electrode connecting wires 5 and the scanning electrode connecting wires 6, wires, which are made of a transparent conductive film of ITO, may be used. The wires preferably have a surface resistance of not lower than 5 Ω/sq and an aspect ratio (wire-length/wire-width) of not lower than 20 for the purpose of obtaining high resistance. In consideration of the occupied areas of these connecting wires on the glass substrate, the wire width is preferably not wider than 50 μm since the wire length is preferably not wider than 1 mm.

Figure 5A:
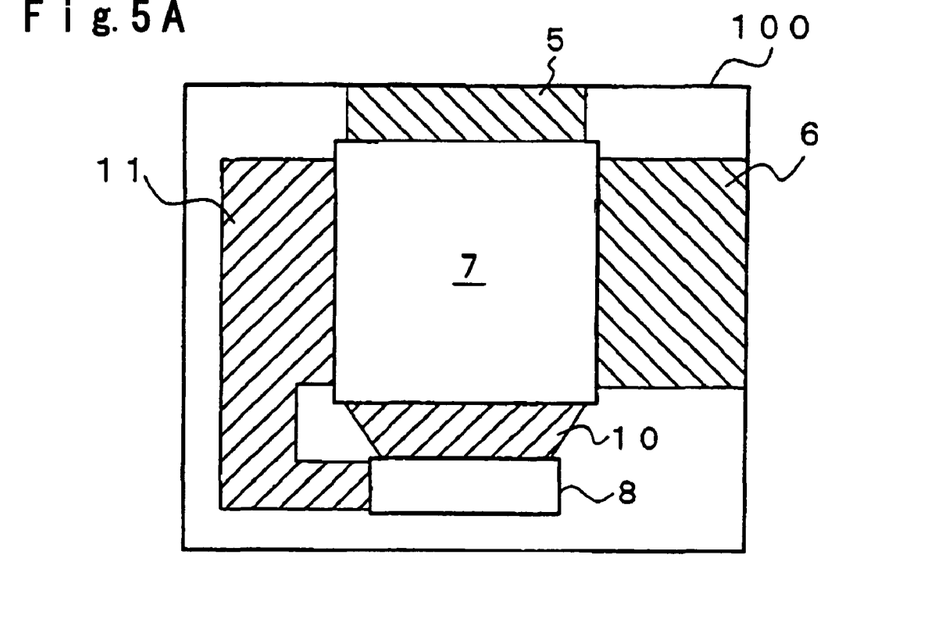
FIGS. 5A and 5B are schematic views showing typical examples of the organic EL display device according to the present invention.

In this embodiment, as shown in the schematic view of FIG. 5A, the data electrode circuitous wires 10 are disposed in an area between an organic EL device 7 and the relevant driver IC 8 on the substrate. The scanning electrode circuitous wires 11 are disposed in an area in the vicinity of a second side of the substrate (a left side of the organic EL display 100 in the shown example), which is orthogonal to a first side of the substrate (a lower side of the organic EL display 100 in the shown example).

The data electrode connecting wires 5, which serve as the first wires for aging connection to supply a signal to the data electrodes 1 from outside the organic EL display 100, are disposed between the first electrodes 1 and a third side of the substrate, which is opposite the first side of the substrate. The scanning electrode connecting wires 6, which serve as the second wires for aging connection to supply a signal to the scanning electrodes 2 from outside the organic EL display 100, are disposed between the scanning electrodes 1 and a fourth side of the substrate, which is opposed the second side of the substrate.

Figure 5B:
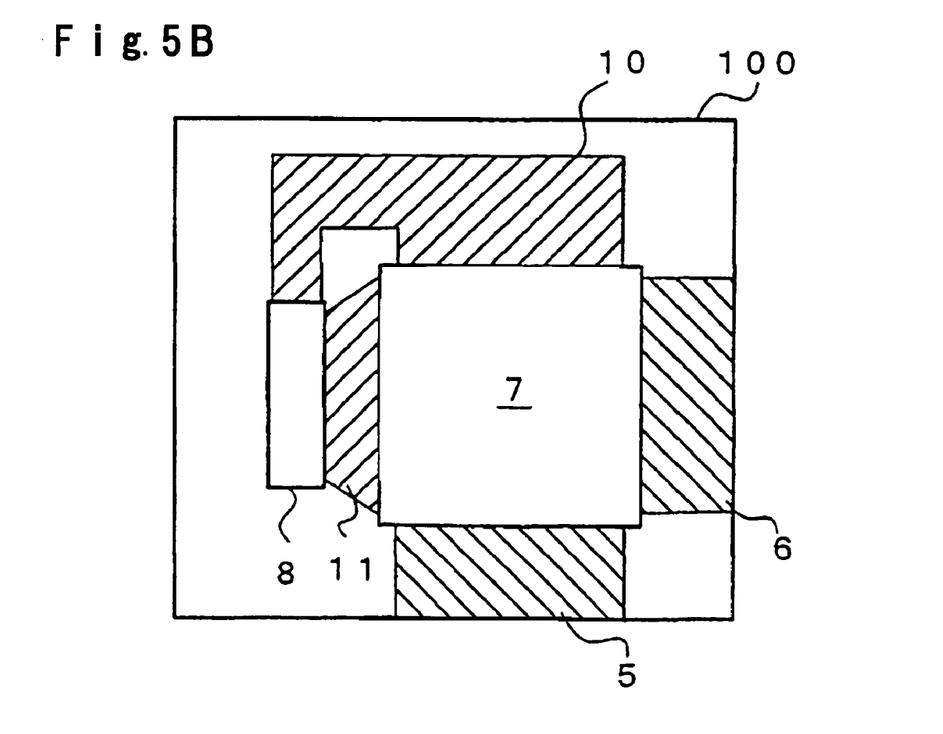

As shown in the schematic view of FIG. 5B, the data electrode circuitous wires 10 may be disposed in an area in the vicinity of the second side of the substrate, which is orthogonal to the first side of the substrate. Additionally, the scanning electrode circuitous wires 11 may be disposed in an area between the organic EL device 7 and the driver IC 8 on the substrate. Additionally, the data electrode connecting wires 5, which serve as the first wires for aging connection to supply a signal to the data electrode 1 from outside the organic EL display 100, may be disposed between the data electrodes 1 and the fourth side of the substrate, which is opposite the second side of the substrate. Additionally, the scanning electrode connecting wires 6, which serve as the second wires for aging connection to supply a signal to the scanning electrodes 2 from outside the organic EL display 100, may be disposed between the scanning electrodes 2 and the third side of the substrate, which is opposite the first side of the substrate. The second side and the fourth side may be positioned at locations, which are reversed with respect to the locations shown in FIGS. 5A and 5B. In the structure shown in FIG. 5B, the driver IC 8 may be positioned at a location, which is rotated at 90 deg with respect to the location shown in FIG. 5B.

The entire disclosure of Japanese Patent Application No. 2003-414315 filed on Dec. 12, 2004 including specification, claims, drawings and summary is incorporated herein by reference in its entirety.

What is claimed is:

1. An organic EL display device, comprising:
    a rectangular substrate having a first side, a second side orthogonal to the first side, a third side opposite the first side and the fourth side opposite the second side;
    an organic EL device mounted on the substrate, the organic EL device including a plurality of data electrodes, a plurality of scanning electrodes and a light emitting layer;
    a driving circuit mounted on the substrate and in the vicinity of the first side of the substrate, the driving circuit driving the organic EL device and comprising an integrated circuit;
    the respective data electrodes being connected to the driving circuit through data electrode circuitous wires;
    the respective scanning electrodes being connected to the driving circuit through scanning electrode circuitous wires;
    the data electrode circuitous wires being disposed in an area between the organic EL device and the driving circuit on the substrate;
    the scanning electrode circuitous wires being disposed in an area in the vicinity of the second side of the substrate;
    first wires for aging connection being disposed between the data electrodes and the third side of the substrate, the first aging connection wires serving to supply a signal to the data electrodes from outside the organic EL display device; and
    second wires for aging connection being disposed between the scanning electrodes and the fourth side of the substrate, the second wires for aging connection serving to supply a signal to the scanning electrodes from outside the organic EL display device.

2. The organic EL display device according to claim 1, wherein the first wires for aging connection or the second wires for aging connection are made of transparent conductive films, and the transparent conductive films have an aspect ratio as wire-length/wire-width of not lower than 20.

3. A substrate for organic EL display devices, wherein a plurality of organic EL display devices, each of which is defined in claim 1, are formed in a single large substrate; first wires for aging connection on all rectangular substrates are electrically connected to one another; and second wires for aging connection on all rectangular substrates are electrically connected to one another.

4. An organic EL display device, comprising:
    a rectangular substrate having a first side, a second side orthogonal to the first side, a third side opposite the first side and the fourth side opposite the second side;
    an organic EL device mounted on the substrate, the organic EL device including a plurality of data electrodes, a plurality of scanningelectrodes and a light emitting layer;
    a driving circuit mounted on the substrate and in the vicinity of the first side of the substrate, the driving circuit driving the organic EL device and comprising an integrated circuit;
    the respective data electrodes being connected to the driving circuit through data electrode circuitous wires;
    the respective scanning electrodes being connected to the driving circuit through scanning electrode circuitous wires;
    the data electrode circuitous wires being disposed in an area in the vicinity of the second side of the substrate;
    the scanning electrode circuitous wires being disposed in an area between the organic EL device and the driving circuit;
    first wires for aging connection being disposed between the data electrodes and the fourth side of the substrate, the first aging connection wires serving to supply a signal to the data electrodes from outside the organic EL display device; and
    second wires for aging connection being disposed between the scanning electrodes and the third side of the substrate, the second aging connection wires serving to supply a signal to the scanning electrodes from outside the organic EL display device.

5. The organic EL display device according to claim 4, wherein the first wires for aging connection or the second wires for aging connection are made of transparent conductive films, and the transparent conductive films have an aspect ratio as wire-length/wire-width of not lower than 20.

6. A substrate for organic EL display devices, wherein a plurality of organic EL display devices, each of which is defined in claim 4, are formed in a single large substrate; first wires for aging connection on all rectangular substrates are electrically connected to one another; and second wires for aging connection on all rectangular substrates are electrically connected to one another.

* * * * *